(12) United States Patent
Stafford et al.

(10) Patent No.: US 6,778,046 B2
(45) Date of Patent: Aug. 17, 2004

(54) LATCHING MICRO MAGNETIC RELAY PACKAGES AND METHODS OF PACKAGING

(75) Inventors: John Stafford, Phoenix, AZ (US); Gordon Tam, Gilbert, AZ (US); Jun Shen, Phoenix, AZ (US)

(73) Assignee: Magfusion Inc., Chandler, AZ (US)

( * ) Notice: Subject to any disclaimer, the term of this patent is extended or adjusted under 35 U.S.C. 154(b) by 0 days.

(21) Appl. No.: 10/126,291

(22) Filed: Apr. 19, 2002

(65) Prior Publication Data

US 2003/0151479 A1 Aug. 14, 2003

Related U.S. Application Data

(60) Provisional application No. 60/322,841, filed on Sep. 17, 2001.

(51) Int. Cl.[7] .............................................. H01H 51/22
(52) U.S. Cl. ............................ 335/78; 335/80; 200/181
(58) Field of Search .................... 335/78, 80; 200/181, 200/572; 257/414, 421, 531

(56) References Cited

U.S. PATENT DOCUMENTS

| | | | |
|---|---|---|---|
| 5,475,353 A | * 12/1995 | Roshen et al. ................ 335/78 |
| 6,016,092 A | * 1/2000 | Qiu et al. .................... 333/262 |
| 6,025,767 A | 2/2000 | Kellam et al. | |
| 6,046,659 A | 4/2000 | Loo et al. | |
| 6,100,477 A | * 8/2000 | Randall et al. ............. 200/181 |
| 6,124,650 A | 9/2000 | Bishop et al. | |
| 6,127,908 A | 10/2000 | Bozler et al. | |
| 6,133,807 A | 10/2000 | Akiyama et al. | |
| 6,153,839 A | 11/2000 | Zavracky et al. | |
| 6,252,229 B1 | * 6/2001 | Hays et al. ............... 250/338.4 |
| 6,384,353 B1 | * 5/2002 | Huang et al. ............... 200/181 |
| 6,528,869 B1 | 3/2003 | Glenn et al. | |

* cited by examiner

*Primary Examiner*—Tuyen T. Nguyen
(74) *Attorney, Agent, or Firm*—Parsons & Goltry; Robert A. Parsons; Michael W. Goltry

(57) ABSTRACT

A method of forming a hermetically sealed MEMS package includes a step of providing a supporting GaAs substrate with at least one contact for the MEMS device on the surface of the supporting substrate and forming a cantilever on the surface of the supporting substrate positioned to come into electrical engagement with the contact in one orientation. A metal seal ring is fixed to the surface of the supporting substrate circumferentially around the contact and the cantilever. A cavity is etched in a silicon chip to form a cap member. A metal seal ring is fixed to the cap member around the cavity. The package is hermetically sealed by reflowing a solder alloy, positioned between the two seal rings, in an inert environment without the use of flux.

8 Claims, 4 Drawing Sheets

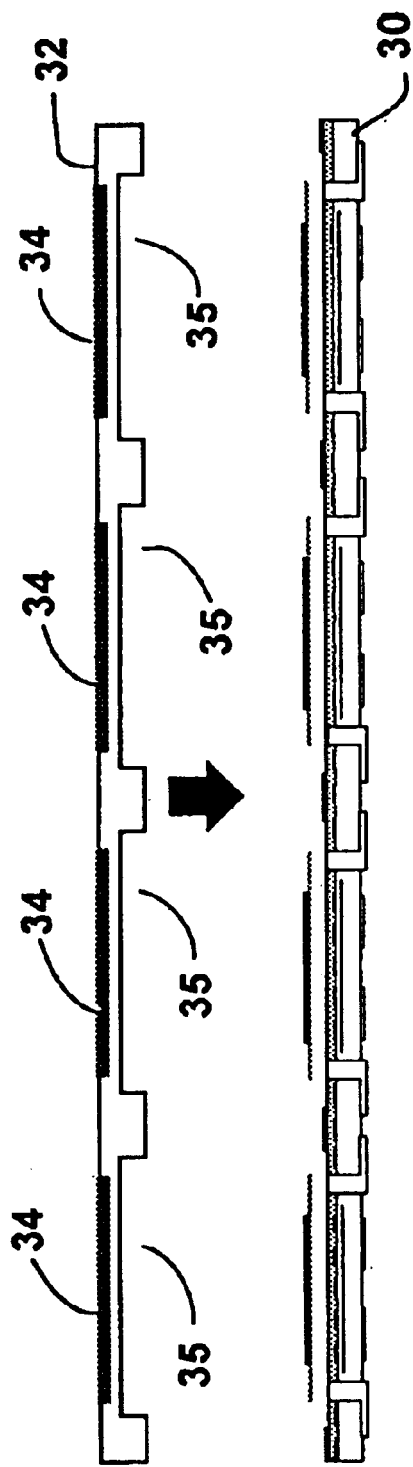
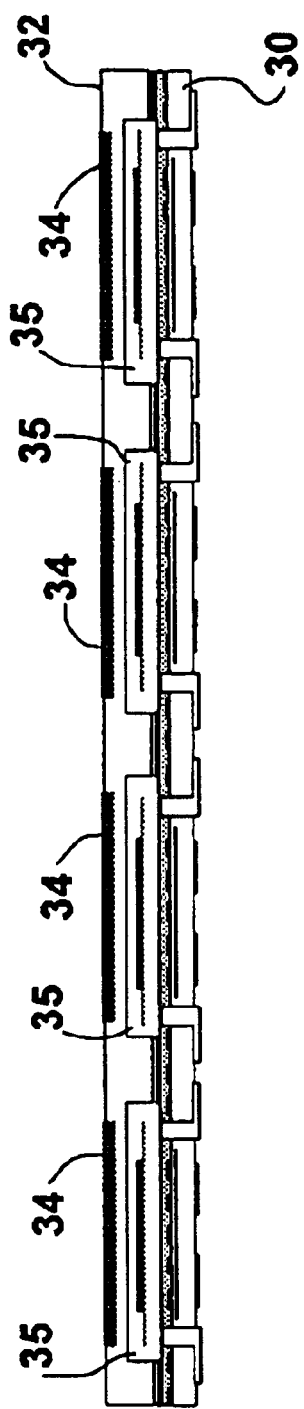
FIG. 4
FIG. 5

LATCHING MICRO MAGNETIC RELAY PACKAGES AND METHODS OF PACKAGING

CROSS-REFERENCE TO RELATED APPLICATION

This application claims the benefit of U.S. Provisional Application Ser. No. 60/322,841, entitled MICRO MAGNETIC SWITCH FABRICATION AND APPARATUS, filed Sep. 17, 2001.

FIELD OF THE INVENTION

This invention relates to latching micro magnetic relays.

More particularly, the present invention relates to methods of packaging latching micro magnetic relays and the various packages.

BACKGROUND OF THE INVENTION

Recently, novel latching micro magnetic relays were discovered. The novel latching micro magnetic relay is based on preferential magnetization of a soft magnetic cantilever in a permanent external magnetic field. Switching between two magnetic states is accomplished by momentarily changing the direction of the cantilever's magnetization by passing a short current pulse through a planar coil situated adjacent the cantilever. Once the relay is switched, it is held in this nonvolatile state (latched) by the permanent external magnetic field. Additional information as to the construction and operation of the novel latching micro magnetic relay is disclosed in a copending U.S. patent application entitled "Electronically Switching Latching Micro-Magnetic Relay and Method of Operating Same", with Ser. No. 09/496,446, filing date Feb. 2, 2000, and incorporated herein by reference. While a specific latching micro magnetic relay is described above, it will be understood that other Micro Electro Mechanical Systems (MEMS) devices that incorporate magnets are also included in this description.

In the prior art, the cantilever for micro magnetic switches was fabricated as a complete portion of the switch by providing a sacrificial layer of photoresist, depositing the material of the cantilever on the surface of the photoresist and then etching or otherwise dissolving the photoresist layer to provide a cantilever. One problem with this prior art method is that any process steps performed subsequent to the application of the photoresist layer are seriously limited because of potential damage to the photoresist material and, thus, potential faults or weaknesses in the final product.

Also, in most prior art packaging techniques relatively high temperatures are required for some of the later steps. These high temperatures can seriously affect magnets and some of the other components enclosed in the packages. Further, the materials that could be used as the supporting substrate for the MEMS devices is seriously limited by the fabrication and packaging techniques.

It would be highly advantageous, therefore, to remedy the foregoing and other deficiencies inherent in the prior art.

Accordingly, it is an object the present invention to provide a new and improved latching micro magnetic relay and package.

Another object of the present invention is to provide a new and improved latching micro magnetic relay package that can be fabricated on a variety of substrates.

Another object of the present invention is to provide a new and improved latching micro magnetic relay package that is easy and inexpensive to manufacture.

A further object of the present invention is to provide a new and improved latching micro magnetic relay package fabricated with low temperature assembly.

Still another object of the present invention is to provide a new and improved latching micro magnetic relay package that can be hermetically sealed on any of a variety of improved substrates using relatively low temperature.

SUMMARY OF THE INVENTION

Briefly, to achieve the desired objects of the present invention in accordance with a preferred embodiment thereof, provided is a method of forming a package and sealing a MEMS device in the package including the steps of providing a supporting substrate, forming at least one contact for the MEMS device on the surface of the supporting substrate and providing an external connection to the contact, forming a cantilever on the surface of the supporting substrate, the cantilever being positioned to come into electrical engagement with the contact in one orientation, and depositing a seal ring on the surface of the supporting substrate circumferentially around the contact and the cantilever. The method further includes the steps of forming a cap member with a cavity and a continuous edge circumferentially around the cavity, the cavity being designed to receive the cantilever and contact therein, and depositing a seal ring on the continuous edge of the cap member. The package is then sealed by sealingly engaging the seal ring on the continuous edge of the cap member to the seal ring on the surface of the supporting substrate.

In a preferred and more specific embodiment, the sealed package includes a supporting substrate with a surface, at least one contact for the MEMS device on the surface of the supporting substrate with an external connection to the contact and a cantilever on the surface of the supporting substrate, the cantilever being positioned to come into electrical engagement with the contact in one orientation. A metal seal ring is fixed on the surface of the supporting substrate circumferentially around the contact and the cantilever. A cap member is formed with a cavity and a continuous edge circumferentially around the cavity. The cavity is designed to receive the cantilever and contact therein with the continuous edge in mating engagement with the metal seal ring on the surface of the supporting substrate. A metal seal ring is fixed on the continuous edge of the cap member. The metal seal ring on the continuous edge of the cap member is sealingly engaged with the metal seal ring on the surface of the supporting substrate. In the preferred embodiment the two metal seal rings are sealingly engaged or fixed together by a solder alloy that is reflowed in an inert environment without the use of flux.

BRIEF DESCRIPTION OF THE DRAWINGS

The foregoing and further and more specific objects and advantages of the invention will become readily apparent to those skilled in the art from the following detailed description of a preferred embodiment thereof, taken in conjunction with the drawings in which:

FIG. 4 is a more detailed and enlarged sectional view of the wafers of FIG. 2 in alignment, prior to bonding;

FIG. 5 is a more detailed and enlarged sectional view of the wafers of FIG. 4 in alignment, subsequent to bonding;

DETAILED DESCRIPTION OF A PREFERRED EMBODIMENT

Figure 1:
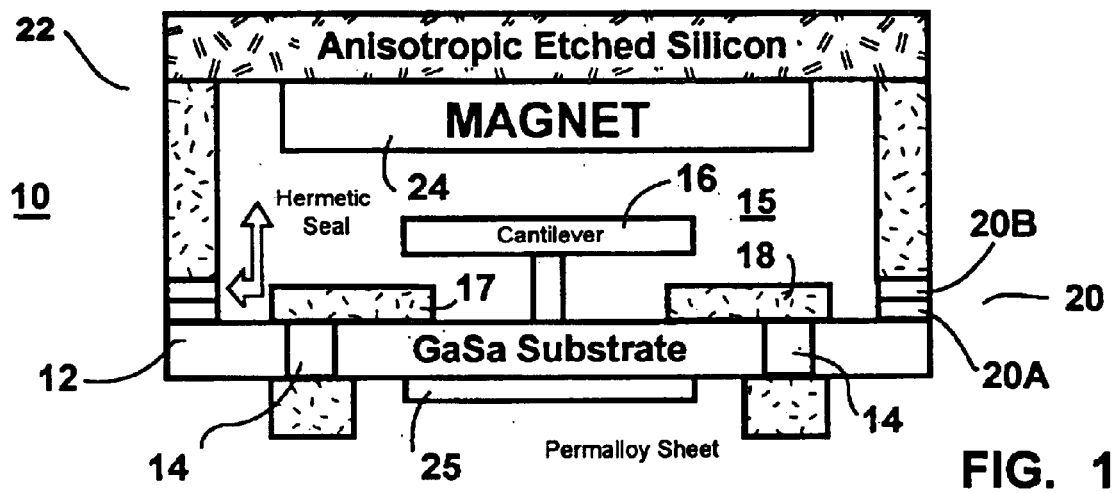
FIG. 1 is a simplified sectional view illustrating one embodiment of a wafer scale packaging process for a latching micro magnetic relay.

Turning now to FIG. 1, a wafer scale package 10 is illustrated for a latching micro magnetic relay or other MEMS structures incorporating a magnet or other heat sensitive components. As will be described in more detail below, one major advantage of package 10 is that it can be assembled using solder preforms and low temperature assembly. Low temperature assembly is desirable because the magnet incorporated in the MEMS structure can easily be damaged by too much heat.

As will become apparent from the discussion below, package 10 can be fabricated in wafer format and does not require the assembly of the MEMS devices individually into individual packages. As described in conjunction with the above structure, a plurality of MEMS devices are generally formed simultaneously on a single wafer. If the wafer must be separated into individual MEMS devices and each individual device packaged separately, the labor cost becomes very high.

In this specific embodiment, a GaAs substrate 12 is used but it should be understood that the substrate could be formed of silicon, glass, quartz, or any other conveneint material that provides the desired characteristics, such as any of the well known semiconductor material, such as silicon, gallium arsenide, etc., or it can include quartz ceramics, various organic or magnetic materials, etc. Generally, as will be understood by those skilled in the art, a GaAs substrate is preferred because the material provides substantial benefits at higher frequencies. However, the art of silicon processing has developed to a very advanced state in the semiconductor field and is, therefore, very useful in the present invention. Also, in some specific applications, cooperating or externally connected circuitry can be formed directly on the same substrate to reduce connection losses. As will be explained in more detail presently, substrate 12 is generally included as a small portion of a much larger wafer, the individual packages 10 being separated only after substantial portions of the fabrication are completed.

In this preferred embodiment, a pair of vias 14 are provided in substrate 12 and can be formed by any of a variety of well known processes including etching, laser drilling, etc. Generally, the method of formation of vias 14 is determined by the cost of the different procedures. Also, vias 14 are plugged or filled with a conductive material. Technology for plugging or filling vias 14 in GaAs, silicon, or glass exists and will not be elaborated upon in this disclosure. The lower or external portions of vias 14 are barrier plated for solderability to allow solder bumping or direct solder attachment to a printed wiring board, ceramic board, etc. Also, the lower or external portions of vias 14 form an I/O interface which in the finished format allow for the clearance of the finished package off the surface of a mounting board (not shown).

In general, once vias 14 in substrate 12 are plugged, fabrication of a MEMS device 15 on substrate 12 proceeds in a normal fashion. Because virtually any type of MEMS device can be incorporated into package 10, MEMS device 15 is represented in FIG. 1, simply by a cantilever 16 positioned to provide a contact between spaced apart conductive pads 17 and 18 in an activated state. A hermetic seal ring 20A is positioned around each MEMS device 15 on the wafer (substrate 12). Because a plurality of packages 10 are formed simultaneously on a common wafer, seal rings 20A are all patterned on the wafer surface using common patterning steps.

Seal ring 20A is preferrably metallized onto the surface of wafer 12 and generally includes a thin portion or layer (an adhesion layer) of material or metal that adheres well to wafer 12 (e.g. tungsten, titanium, or combinations thereof) and a thicker portion or layer (a sealing layer) of a sealing or junction material, e.g., nickel/gold, chrome/gold, etc. Generally, at least a 0.5 mm seal ring 20A around each MEMS device 15 is provided for a hermetic seal. Also, provisions are included for a saw kerf between adjacent die when the wafer is separated into individual packages. A disadvantage is that seal ring 20A and the saw kerf use substantial wafer area, but various procedures and alterations may be incorporated to minimize this problem.

A silicon wafer is provided to form a hermetic cap 22 to be incorporated with a seal ring 20B. While a single cap 22 is illustrated it will be understood that a number of caps will be formed in the silicon wafer equal to the number of MEMS devices formed in the GaAs wafer. Again it will be understood that hermetic cap 22 could be formed from other material, such as glass, ceramic, etc. but silicon is used in this preferred embodiment because of the vast knowledge and machinery available for working with silicon. Anisotropic etching of vias, holes grooves, etc. in silicon wafers is a reasonably well understood process.

A silicon wafer of the right thickness to house a magnet 24 and to clear cantilever 16 of MEMS device 15 is selected. Holes, e.g. circular, square, etc., are etched in the silicon wafer on a precise pitch. The precise pitch is of course the same pitch used to form MEMS devices 15 and seal rings 20A on the GaAS wafer (substrate 12). Seal ring 20B is metallized on the lower lips of each cap 22 and formed generally as described for seal ring 20A above. To allow a hermetic sealing of cap 22 to substrate 12 an 80/20 Au/Sn preform is tack welded to either metallized seal ring, that is seal ring 20A on substrate 12 or seal ring 20B on cap 22. In another method, 80/20 Au/Sn alloy can be plated on seal ring 20B of cap 22. In this procedure, plating the alloy on the seal ring is believed to be more variable than using a tacked preform.

At any convenient time during the fabrication, a magnet 24 is aligned and bonded (e.g. by epoxy or other suitable adhesive) into the cavity in each cap 22 of the silicon wafer. To this end, using machine vision allows magnets 24 to be precisely placed in the center of each cavity. It will be understood that, in some specific applications, magnet 24 can be placed outside of the package, if desired.

The anisotropically etched caps 22 on the silicon wafer are aligned to the MEMS device on the GaAs wafer and hermetically sealed by reflowing the 80/20 Au/Sn alloy in an inert environment without the use of any flux. Thus, metal seal ring 20A and metal seal ring 20B are affixed together to form a compound seal ring 20. An appropriate fiducial/alignment scheme can be developed for the wafers to ensure each magnet 24 is aligned to within +/−0.001" of the center of each and every MEMS device 15.

The coefficient of thermal expansion of silicon is 2.3–4.7 (ppm/C) and for GaAs is 5.4–5.72 (ppm/C). There thus would be a minimal mismatch in the coefficient of thermal expansion of about 2 (ppm/C). The consequence of this mismatch is that if stress problems arise in specific application, an Au/Sn alloy which is some what more tin rich could be used to provide the stress relief. In applications where the substrate and cap are formed of similar material thermal expansion is not a problem. The use of other lower temperature solder is possible in all cases as long as fluxless soldering processes are used.

While the above structure provides a complete hermetic seal for the micro magnetic relay or other MEMS structure, it will be understood that in some applications such hermeticity is or may not be required. Thus, in such applications instead of the metal seal rings and/or the solder, the cap may simply be epoxied or otherwise adhered to the substrate or the seal rings may be epoxied or adhered together.

Finally, a permalloy backing sheet 25 (magnetic flux concentrator) is bonded to the I/O side of the hermetically sealed wafer scale package 10. Permalloy backing sheet 25 is preferrably of a grillage format to allow bonding of all sites (i.e. all packages 10 on the GaAs wafer) at once. The exposed surface of permalloy backing sheet 25 preferably is provided with an organic dielectric coating. The dielectric coating ensures that no electric paths develop between the external portions of vias 14 or any conductors on the surface of the mounting board. The bonded side of permalloy backing sheet 25 preferably has a pressure sensitive thermally cureable adhesive thereon. By supplying a pressure sensitive adhesive on permaloy backing sheet 25 assembly can be accomplished very easily.

Generally, an advantage of wafer scale packages 10 is that they can be tested in wafer format (i.e. before separation into individual parts) and then the wafer can be solder bumped if desired. The wafer is then sawn, or otherwise separated, to provide singulated components. Alternatively, the wafer could be sawn to provide singulated components and then tested and individually solder bumped if desired. Implicit in this procedure is that the wafer die yield is very high (approximately +98%).

Figure 2:
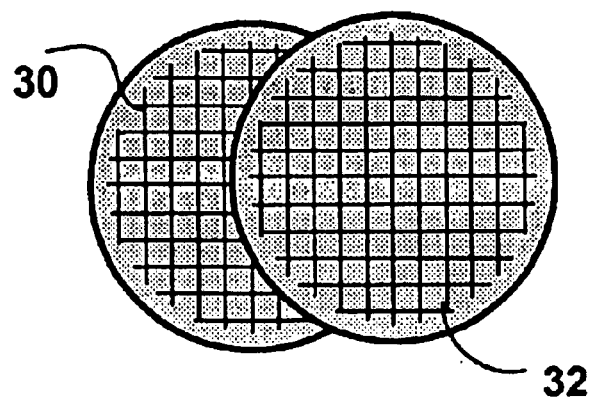
FIG. 2 is a view in top plan of a pair of wafer as used in the present invention.
Figure 3:
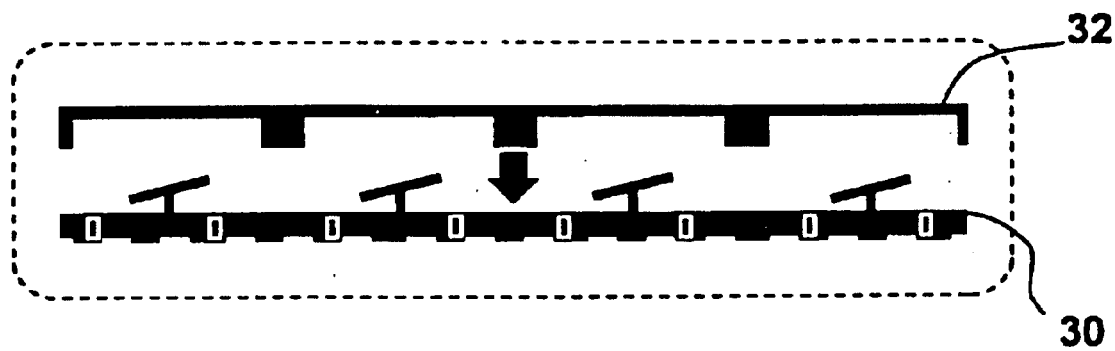
FIG. 3 is a simplified sectional view of the wafers of FIG. 2 in alignment, prior to bonding.

Turning now to FIG. 2, a pair of wafers 30 and 32 (device and encapsulation wafers, respectively) are provided. Here it will be understood that wafers 30 and 32 can include any of the well known semiconductor material, such as silicon, gallium arsenide, etc., or they can include quartz ceramics, various organic or magnetic materials, etc. Referring additionally to FIG. 3, it can be seen that an array of latching micro magnetic relays or other MEMS structures are formed on wafer 30 and a similar array of caps are formed in wafer 32. Wafers 30 and 32 are axially aligned in overlying relationship so that a cap in wafer 32 overlies each latching micro magnetic relay or other MEMS structure on wafer 30.

Figure 6:
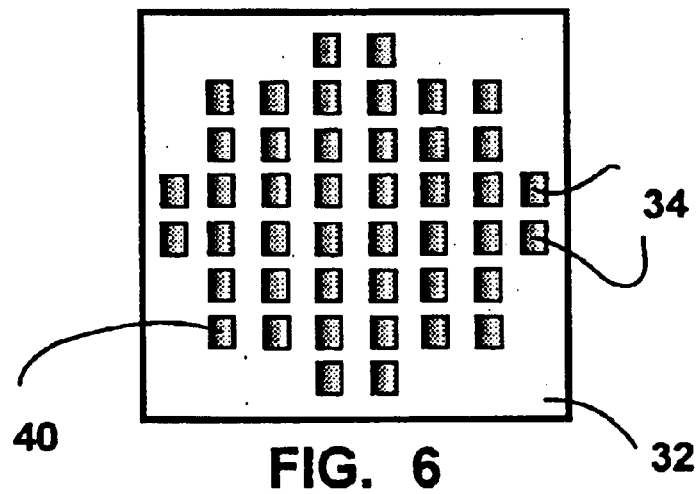
FIG. 6 is a view in top plan of a portion of the bonded wafers prior to dicing.
Figure 7:
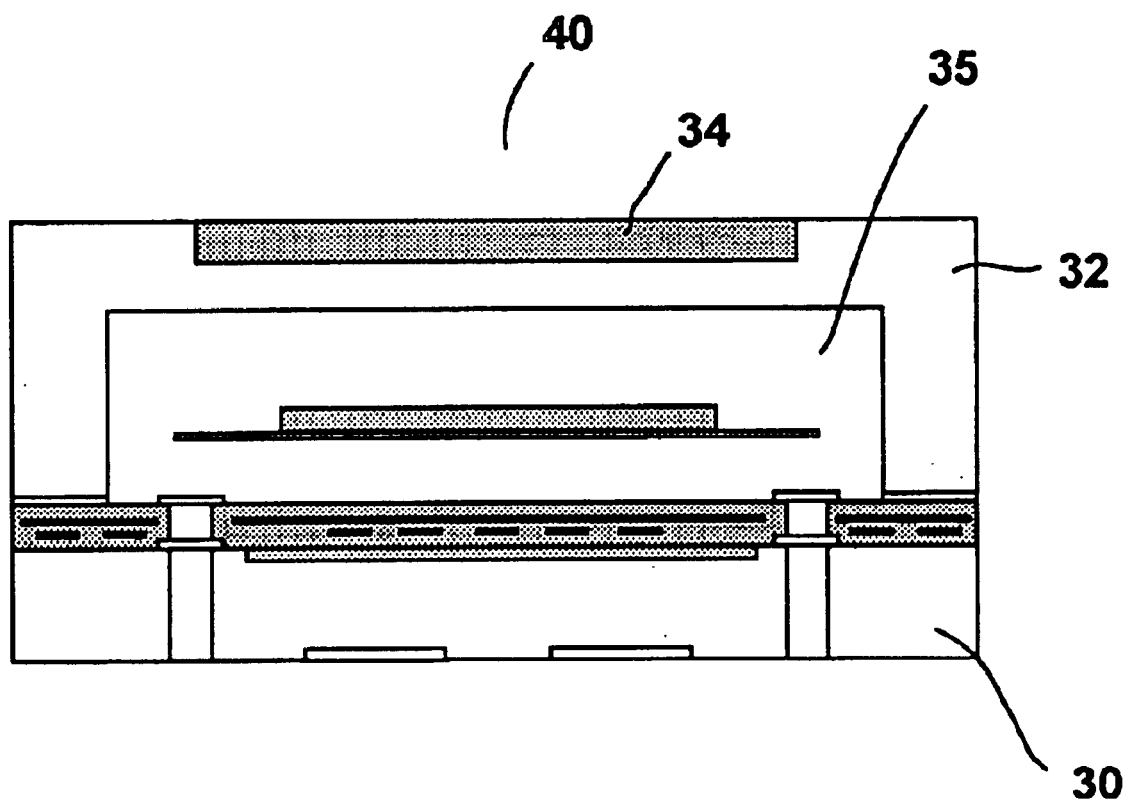
FIG. 7 is and enlarged sectional view of a single package after dicing.

Referring additionally to FIG. 4, an enlarged more detailed sectional view is illustrated of wafers 30 and 32. From this view it can be seen that magnets 34 are positioned in the upper surface of wafer 32 and aligned, one each, with cavities 35 in the lower surface of wafer 32. Wafers 30 and 32 are then brought together and bonded, as illustrated in FIG. 5. Thus, an array of wafer scale packages are manufactured simultaneously in wafers 30 and 32, as illustrated in FIG. 6. The bonded wafers are then diced, or otherwise separated into a plurality of wafer scale packages. A single one of the wafer scale packages, designated 40, is illustrated in an enlarged sectional view in FIG. 7. The individual packages can be tested before dicing and/or after dicing if desired.

Figure 8:
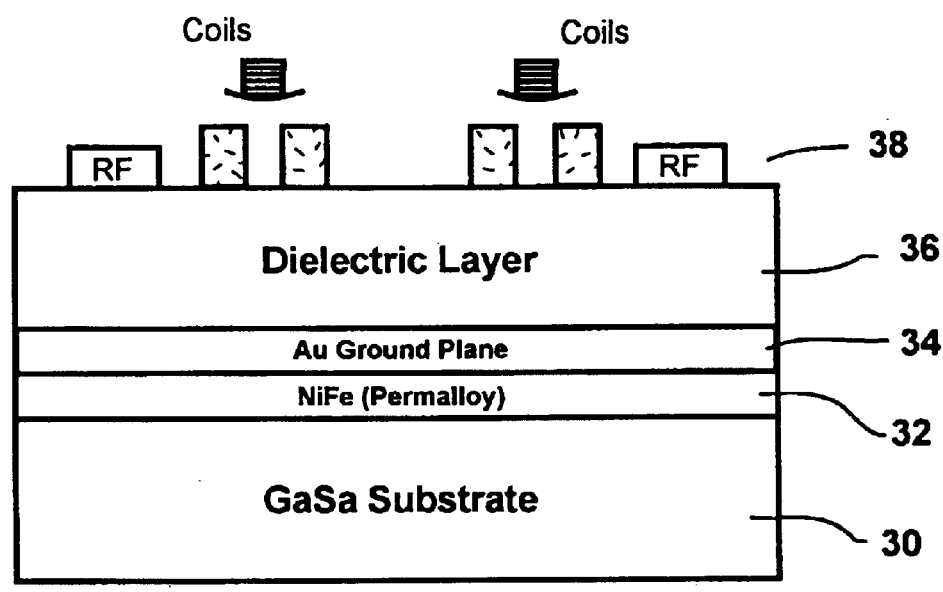
FIG. 8 is a simplified sectional view illustrating portions of another embodiment of a wafer scale packaging process for a latching micro magnetic relay.

Turning now to FIG. 8, one way to save some of the area required for hermetically sealing wafer scale MEMS package 10 is illustrated. In this procedure, the package is modified from a single plane layout to a multilayer layout. In the multilayer layout of FIG. 8, the structure includes a substrate 50, a permalloy layer 52, a ground plane 54, an insulating dielectric layer 56, and a layer 58 for RF routing and coils. Here it is also assumed the the MEMS cantilever (not shown) is mounted in the same plane as the RF lines. Ground plane 54 is formed of electrically conductive but non-magnetic material (e.g. gold or the like) so as not to reduce the effects of permalloy layer 52. Also, capacitance coupling effects can be mitigated by controlling the thickness of dielectric layer 56.

The structure described above can save wafer space but will include additional mask layers and fabrication steps. A polymer dielectric that can be used in lieu of polyimide and has RF potential because of its low loss, is Dow ChemicIal's benzocyclobutene (BCB). This material has been used extensively for high density interconnects in multi chip modules. Another possible high frequency dielectric that can be used is one of the formulations of nitride which is inorganic.

Thus, a new and improved latching micro magnetic relay or MEMS package has been disclosed, which is highly adaptable and easy to manufacture. Also, the improved package and methods of fabrication can incorporate a variety of different supporting substrates. Further, a variety of different caps can be easily fabricated and applied to the substrate using low temperature processes. Because the preferred manufacturing process contemplates the simultaneous fabrication of a plurality of packages on a single wafer, the packages can be tested at various points during the manufacturing process and defective packages can be eliminated before too much time and resources are expended.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A sealed package including a MEMS device comprising:

a supporting substrate with a surface;

at least one contact for the MEMS device on the surface of the supporting substrate with an external connection to the contact and a cantilever on the surface of the supporting substrate, the cantilever being positioned to come into electrical engagement with the contact in one orientation;

a substrate metal seal ring fixed on the surface of the supporting substrate circumferentially around the contact and the cantilever, the substrate metal seal ring comprising an adhesion portion including at least one metal layer selected to adhere to the substrate and a sealing portion including at least one metal layer selected as a junction material;

a cap member with a cavity and a continuous edge circumferentially around the cavity, the cavity being designed to receive the cantilever and contact therein with the continuous edge in mating engagement with the metal seal ring on the surface of the supporting substrate;

a cap metal seal ring fixed on the continuous edge of the cap member, the cap metal seal ring comprising an adhesion portion including at least one metal layer selected to adhere to the cap member and a sealing portion including at least one metal layer selected as a junction material; and the junction material of the cap metal seal ring on the continuous edge of the cap member sealingly engaged with the junction material of the substrate metal seal ring on the surface of the supporting substrate.

2. A sealed package as claimed in claim 1 wherein the supporting substrate and the cap member each include one of GaAs, glass, silicon, quartz, ceramic, organic material, and magnetic material.

3. A sealed package as claimed in claim 1 wherein the adhesion portions of the substrate metal seal ring and the cap metal seal ring each include one of tungsten, titanium, and combinations thereof.

4. A sealed package as claimed in claim 1 wherein the sealing portions of the substrate metal seal ring and the cap metal seal ring each include one of nickel, gold, chrome, and alloys thereof.

5. A sealed package as claimed in claim 1 wherein the sealing portion of the cap metal seal ring on the continuous edge of the cap member is sealingly engaged with the sealing portion of the substrate metal seal ring on the surface of the supporting substrate by a solder alloy.

6. A sealed package as claimed in claim 5 wherein the colder alloy includes a solder alloy of 80/20 Au/Sn.

7. A package with a MEMS device hermetically sealed in the package comprising:

a supporting GaAs substrate with a surface;

at least one contact for the MESS device on the surface of the supporting substrate with an external connection to the contact;

a cantilever on the surface of the supporting substrate, the cantilever being positioned to move into electrical engagement with the contact in a first orientation and out of electrical engagement with the contact in a second orientation in response to activation of the MEMS device;

a substrate metal seal ring fixed on the surface of the supporting substrate circumferentially around the contact and the cantilever, the substrate metal seal ring including an adhesion portion adhered to the surf ace of the supporting substrate and a sealing portion adhered to the adhesion portion;

a silicon chip forming a cap member and defining a cavity with a continuous edge circumferentially around the cavity, the cavity being designed to receive the cantilever and contact therein;

a cap member metal seal ring fixed on the continuous edge of the cap member, the cap member metal seal ring including an adhesion portion adhered to the surface of the continuous edge of the cap member and a sealing portion adhered to the adhesion portion;

a permanent magnet affixed to the cap member;

a solder alloy sealingly engaging the sealing portion of the cap member metal seal ring on the continuous edge of the cap member to the sealing portion of the substrate metal seal ring on the surface of the supporting substrate; and a permaloy magnetic flux concentrator affixed to the supporting substrate in a position to cooperate with the permanent magnet to hold the cantilever in either of the first and second orientations.

8. A package as claimed in claim 7 wherein the package is hermetically sealed by ref lowing the solder alloy in an inert environment without the use of flux.

* * * * *